(12) United States Patent
Lin

(10) Patent No.: US 12,538,453 B2
(45) Date of Patent: Jan. 27, 2026

(54) THERMOSIPHON FOR COMPUTING COMPONENTS

(71) Applicant: AMD Design, LLC, Wilmington, DE (US)

(72) Inventor: Ting Yu Lin, Fairfield, NJ (US)

(73) Assignee: AMD Design, LLC, Wilmington, DE (US)

( * ) Notice: Subject to any disclaimer, the term of this patent is extended or adjusted under 35 U.S.C. 154(b) by 189 days.

(21) Appl. No.: 18/466,122

(22) Filed: Sep. 13, 2023

(65) Prior Publication Data

US 2025/0089209 A1   Mar. 13, 2025

(51) Int. Cl.
*H05K 7/20* (2006.01)
(52) U.S. Cl.
CPC ..... *H05K 7/20309* (2013.01); *H05K 7/20327* (2013.01)
(58) Field of Classification Search
CPC .. F28D 15/0266; F28D 15/02; F28D 15/0233; F28D 15/043; F28D 15/00; F28D 2021/0029; F28D 1/0213; F28D 1/0226; F28D 20/0034; F28D 2015/0216; F28D 5/00; F28D 21/00; H01L 23/427; H01L 23/473; H01L 21/4882; H01L 23/367; H01L 23/3675; H01L 23/46; H05K 7/20309; H05K 7/20327; H05K 7/20809; H05K 7/20818; H05K 7/203; H05K 7/20381; H05K 7/20781; H05K 1/0203; H05K 2201/064; H05K 3/0061; H05K 7/20236; H05K 7/20245; H05K 7/2029; H05K 7/20836; H05K 7/20736; H05K 7/2039; G06F 1/20; G06F 2200/201; G06F 1/206; F25B 39/02; F25B 39/00; H01M 10/6569
See application file for complete search history.

(56) References Cited

U.S. PATENT DOCUMENTS

| | | | |
|---|---|---|---|
| 7,525,801 B2 * | 4/2009 | Luo | G06F 1/203 |
| | | | 174/15.1 |
| 9,557,117 B2 * | 1/2017 | Yoshikawa | F28F 9/026 |
| 2003/0205363 A1 * | 11/2003 | Chu | F28D 15/0266 |
| | | | 165/104.33 |
| 2005/0082158 A1 * | 4/2005 | Wenger | F28D 15/043 |
| | | | 159/901 |

(Continued)

OTHER PUBLICATIONS

Patel Chandrakant, Directional Coolant control, WO-2017127059-A1 (Year: 2017).*

*Primary Examiner* — Michael A Matey
(74) *Attorney, Agent, or Firm* — SCULLY, SCOTT, MURPHY & PRESSER, P.C.

(57) ABSTRACT

A thermosiphon is provided for a computing system. The thermosiphon includes an evaporating portion and a pool portion. The evaporating portion is operable to be in thermal communication with a computing component of the computing system. The evaporating portion is operable to retain an evaporating volume of fluid to lower a temperature of the computing component. The pool portion is in fluid communication with the evaporating portion. The pool portion is operable to receive excess fluid of the fluid from the evaporating portion when a volume of the fluid in the evaporating portion is greater than the evaporating volume.

19 Claims, 8 Drawing Sheets

(56) References Cited

U.S. PATENT DOCUMENTS

| | | | |
|---|---|---|---|
| 2006/0117764 A1* | 6/2006 | Patel | F28D 15/02 |
| | | | 62/310 |
| 2012/0268877 A1* | 10/2012 | Rice | H05K 7/20245 |
| | | | 165/104.21 |
| 2015/0174709 A1* | 6/2015 | Rice | F28D 15/0275 |
| | | | 29/890.038 |
| 2018/0049346 A1* | 2/2018 | Chiriac | H01L 23/427 |
| 2020/0015388 A1* | 1/2020 | Farshchian | F28D 15/0233 |

\* cited by examiner

THERMOSIPHON FOR COMPUTING COMPONENTS

FIELD

The present disclosure relates generally to a thermosiphon operable to cool computing components.

BACKGROUND

Cooling systems can be utilized control the temperature of computing components for computing systems. Thermosiphons provide a passive heat exchange by circulating a fluid. Unlike traditional watercooling systems, thermosiphons do not rely on a pump but on convection for the movement of the fluid (for example water) from the computing components upwards to a heat exchanger. The fluid is cooled at the heat exchanger and is ready to be recirculated.

BRIEF DESCRIPTION OF THE DRAWINGS

Implementations of the present technology will now be described, by way of example only, with reference to the attached figures, wherein.

DETAILED DESCRIPTION

Figure 1A:
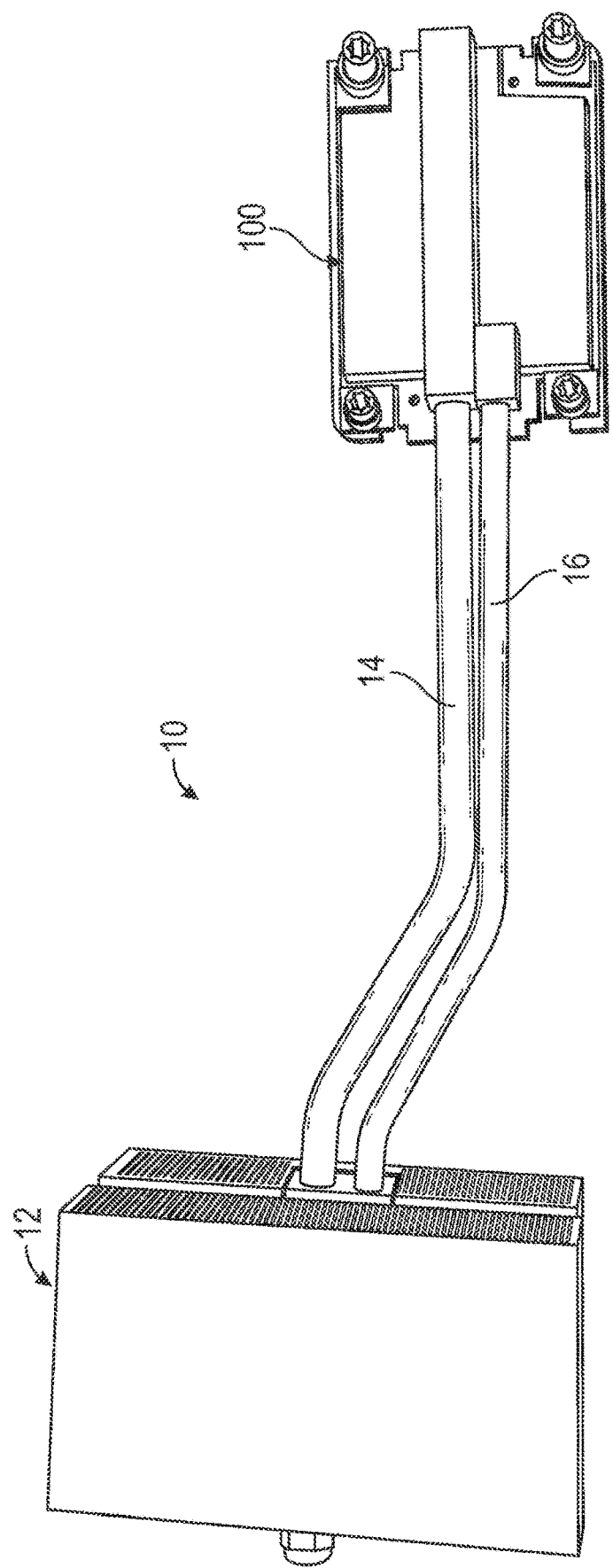
FIG. 1A illustrates a thermal system for a computing component.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

Managing temperatures is a challenge for cooling high power components. For example, air cool heat sink thermal performance can be a limitation. There is a risk of overheating on high power components of computing components. Fan power consumption is very high by air cooling heat sinks. Fans running at high speeds can create significant acoustic issues. Liquid cooling by cold plates or immersion cooling has service and cost issues. Thermal performance of traditional thermosiphons is not sufficient for such high powered components, and the temperature of those computing components can still be higher than the maximum allowed temperature.

Figure 1B:
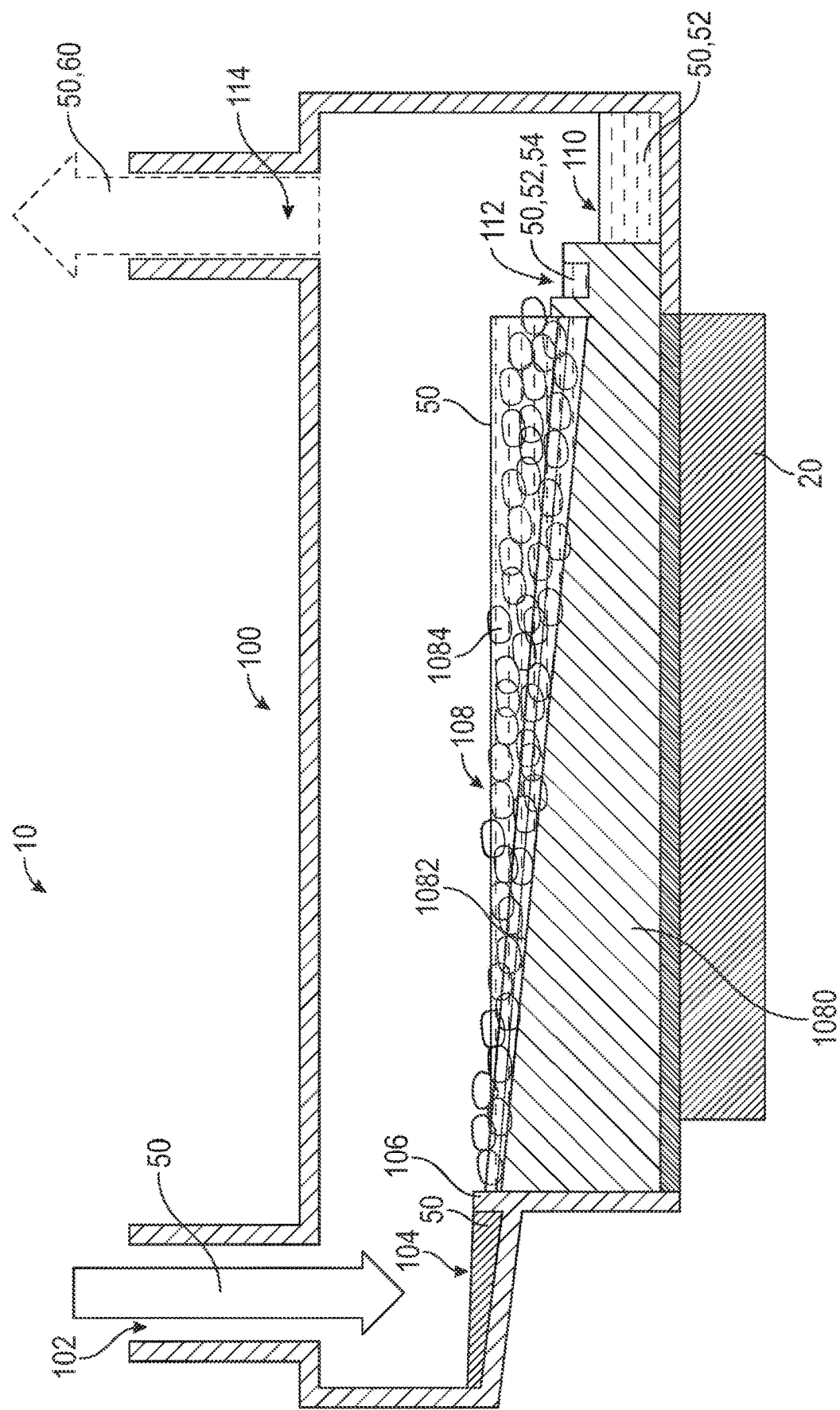
FIG. 1B illustrates a cross-sectional diagram of a thermosiphon of the thermal system.

FIG. 1A illustrates a thermal system 10 for a computing system (not shown). The thermal system 10 can include a thermosiphon 100 which can be operable to provide a passive heat exchange by creating a cyclic flow of a fluid from areas of high heat to low temperature and remove heat away, and back. The thermal system 10 can be utilized to manage a temperature of one or more computing components, such as a processor 20 (as shown in FIG. 1B). For example, more than one thermosiphon 100 can be utilized. In some examples, one thermosiphon 100 can cover a plurality of computing components 20 to manage the temperature of the plurality of computing components 20.

The thermal system 10 can include an inlet conduit 16 and an outlet conduit 14 that fluidly connect the thermosiphon 100 with a heat exchanger 12. The inlet conduit 16 can provide fluid (e.g., water, coolant, etc.) in liquid form to the thermosiphon 100. The fluid in the liquid form can flow in the thermosiphon 100 and evaporate as the heat from the computing component 20 is transferred from the computing component 20 to the thermosiphon 100 and to the fluid. The evaporation of the fluid lowers the temperature of the thermosiphon 100 and subsequently the computing component 20. The evaporated fluid then passes into the outlet conduit 14 and towards the heat exchanger 12. At the heat exchanger 12, the evaporated fluid cools down to a lower temperature. As the temperature of the evaporated fluid lowers, the fluid condenses back to liquid form. The liquid fluid in the heat exchanger 12 then passes back to the inlet conduit 16 towards the thermosiphon 100 to be recirculated. Accordingly, the thermal system 10 does not rely on a pump but on convection for the movement of the heated fluid. The cycle of evaporation and condensation of the fluid is driven by the differences in temperature. This helps manage the temperature of the computing component 20, as computing components 20 such as processors can rapidly reach temperatures that can cause it to malfunction.

Figure 1C:
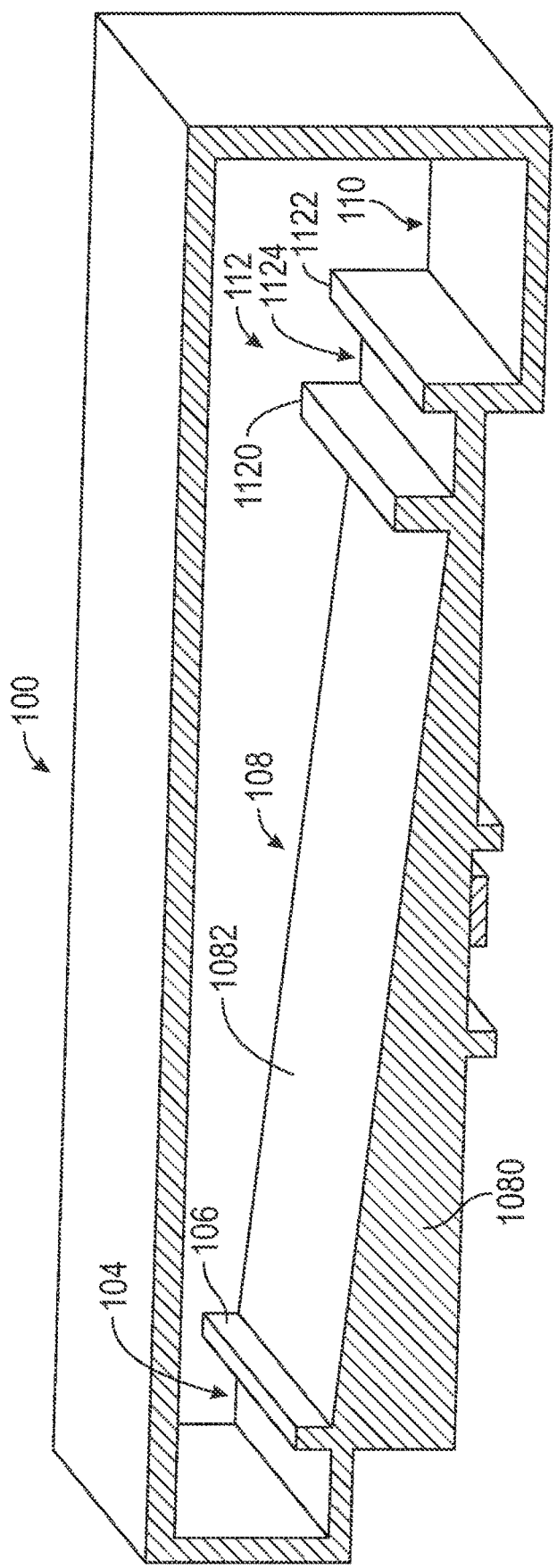
FIG. 1C illustrates a perspective cross-sectional view of the thermosiphon of FIG. 1B.

FIGS. 1B and 1C illustrate a configuration of a thermosiphon 100 for a thermal system 10 that is operable to reduce dry out (e.g., no fluid in liquid form) and flood (e.g., too much fluid 50) issues inside the thermosiphon 100. If the thermosiphon 100 experiences dry out, the heat is not being removed from the computing component 20, and the computing component 20 can malfunction and/or throttle and drop performance. If the thermosiphon 100 experiences flooding, the excess volume of fluid 50 can prevent the fluid 50 from adequately boiling and evaporating, and the heat is not removed from the computing component 20. Accordingly, in the thermosiphon 100 experiences either dry out or flooding, the thermosiphon 100 is not operating at a high performance to manage the heat exchange, and the computing component 20 can malfunction.

Conventional thermosiphons can dry out, flood, have operating angle issues, and consequently lack in thermal performance. The thermosiphon 100 disclosed herein is configured to maintain an evaporating volume of fluid 50 in an evaporating portion 108 within a predetermined range. If the evaporating volume is less than the predetermined range, the thermosiphon 10 can dry out and lose performance, as no fluid 50 is evaporating to lower the temperature. If the evaporating volume is greater than the predetermined range, the thermosiphon 100 may flood so that less fluid 50 is evaporating to remove heat away by latent heat.

As illustrated in FIGS. 1B and 1C, the thermosiphon 100 can include an inlet portion 104, an evaporating portion 108, and a pool portion 110.

The inlet portion 104 can be operable to receive the fluid 50 from a fluid source (e.g., the heat exchanger 12) via an inlet 102. In at least one example, the inlet 102 can be in fluid communication with the inlet conduit 16. The inlet portion 104 can be in fluid communication with the evaporating portion 108 such that the fluid 50 flows from the inlet portion 104 to the evaporating portion 108. In at least one example, the inlet portion 104 can form a slope down towards the evaporating portion 108 such that the fluid 50 flows towards the evaporating portion 108. Accordingly, fluid 50 does not get stagnant in the inlet portion 104, and fresh fluid 50 continually flows towards the evaporating portion 108 so that the volume in the evaporating portion 108 is maintained within the predetermined range to avoid dry out.

In at least one example, the thermosiphon 100 can include an inlet barrier 106 extending between the inlet portion 104 and the evaporating portion 108. The inlet barrier 106 can be operable to restrict flow of the fluid 50 from the inlet portion 104 to the evaporating portion 108 unless a volume of the fluid 50 retained in the inlet portion 104 is greater than an inlet volume such that the fluid 50 flows due to gravity force from a higher level location (e.g., higher than the inlet barrier 106) to a lower level location (e.g., into the evaporating portion 108). By controlling the amount of fluid 50 flowing into the evaporating portion 108, the inlet barrier 106 can assist in preventing flooding of the evaporating portion 108. The inlet barrier 106 allows for better fluid distribution throughout the thermosiphon 100. In at least one example, as illustrated in FIGS. 1B and 1C, the inlet barrier 106 can extend substantially vertically between the inlet portion 104 and the evaporating portion 108. In some examples, the inlet barrier 106 can extend at an angle between the inlet portion 104 and the evaporating portion 108. In some examples, the inlet barrier 106 can be linear. In some examples, the inlet barrier 106 can be curved. The inlet barrier 106 can be configured to extend at an angle from the slope of the inlet portion 104 so that the fluid 50 first pools within the inlet portion 104 before flowing to the evaporating portion 108. Accordingly, the inlet barrier 106 prevents too much fluid 50 from flowing directly from the inlet 102 to the evaporating portion 108 to avoid flooding and/or local dry out.

The evaporating portion 108 can be operable to be in thermal communication with a computing component 20. For example, the evaporating portion 108 can be in contact with the computing component 20. The evaporating portion 108 is operable to receive the heat from the computing component 20 and transfer the heat to the fluid 50 so that the fluid 50 boils and evaporates to remove the heat away. The evaporated fluid 60 then flows out of the thermosiphon 100 via an outlet 114 which is in fluid communication with the outlet conduit 14.

The evaporating portion 108 can have an evaporating surface 1082 which is operable to receive the fluid 50. The evaporating surface 1082 can form a slope down towards the pool portion 110 such that the fluid flows towards the pool portion 110. Accordingly, the slope of the evaporating surface 1082 assists in preventing flooding, as the fluid 50 does not sit and accumulate in the evaporating portion 108 exceeding the desired evaporating volume. The fluid 50 follows the slope of the evaporating surface 1082 and flows towards and into the pool portion 110.

In at least one example, the evaporating portion 108 can have a non-uniform thickness of a base plate 1080 to form the slope of the evaporating surface 1082. The base plate 1080 can be in contact with the computing component 20 and can transfer heat from the computing component 20 to the evaporating surface 1082. For example, the thicker portion of the base plate 1080 adjacent to the inlet portion 104 leads to a lower temperature at the evaporating surface 1082. The thicker portion then needs less fluid 50 to evaporate and adequately remove heat therefrom. The thinner portion of the base plate 1080 adjacent to the pool portion 110 leads to a higher temperature at the evaporating surface 1082. The thinner portion then needs more fluid 50 to evaporate and adequately remove heat therefrom. Accordingly, the non-uniform thickness of the base plate 1080 forming the slope of the evaporating surface 1082 balances the lower and higher heat flux of the corresponding thicker and thinner sides of the base plate 1080.

Figure 2:
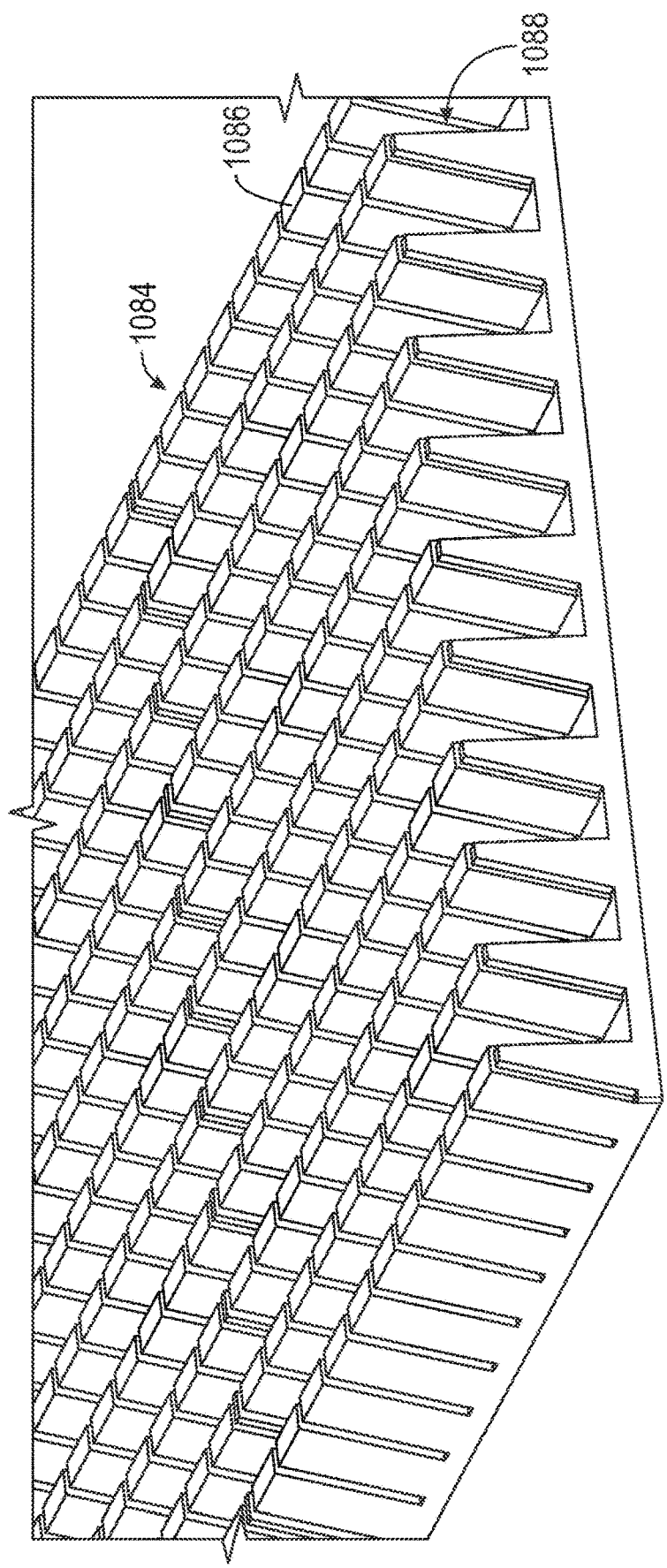
FIG. 2 illustrates a thermal enhancement surface.

In at least one example, the evaporating portion 108 can include a heat transfer enhancement structure 1084. The heat transfer enhancement structure 1084 can include skived fins, porous material, micro-channels, grooves, sintered material, and/or screened mesh. The heat transfer enhancement structure 1084 can be operable to assist with transfer of heat from the computing component 20 to the fluid 50 retained on the evaporating portion 108. The heat transfer enhancement structure 1084 can be disposed on and/or formed on the evaporating surface 1082. In at least one example, referring to FIG. 2, the heat transfer enhancement structure 1084 can increase the surface area in contact with the fluid 50. Accordingly, the heat transfer enhancement structure 1084 can transfer a greater amount of heat to the fluid 50 to cause the fluid 50 to evaporate and remove the heat from the evaporating portion 108 and the computing component 20. In at least one example, as illustrated in FIG. 2, the heat transfer enhancement structure 1084 can form a plurality of fins 1086 and corresponding grooves 1088. The fins 1086 of the heat transfer enhancement structure 1084 can increase the heat transfer area and reduce heat flux. The lower the heat flux the lower the temperature of the computing component 20. Additionally, the grooves 1088 can help move the fluid 50 to the fins 1086 by capillary force which can be generated, for example, through wick structure and/or mesh. With this design of the heat transfer enhancement structure 1084, the fluid 50 evaporates on the fins 1086 and removes more heat. In at least one example, as illustrated in FIG. 2, the fins 1086 can have a trapezoid geometry for better thermal efficiency. In other examples, the fins 1086 can be pyramidal, ovoid, circular, rectangular, and/or other suitable geometries.

Referring back to FIGS. 1B and 1C, the pool portion 110 can be in fluid communication with the evaporating portion 108. The pool portion 110 can be operable to receive excess fluid 52 of the fluid 50 from the evaporating portion 108 when a volume of the fluid 50 in the evaporating portion 108 is greater than the desired evaporating volume. The pool portion 110 is operable to receive the excess fluid 52 from the evaporating portion 108 until the volume of the fluid 50 in the evaporating portion 108 is within the predetermined range of the evaporating volume. Accordingly, the evaporating portion 108 of the thermosiphon 100 can efficiently and effectively lower the temperature of the computing component 20 without concern of flooding. The thermosiphon 100 can maintain a high performance.

In at least one example, the pool portion 110 can be a groove and/or a recess in the thermosiphon 100. Accordingly, the pool portion 110 can be lower than the evaporating portion 108 so that a volume of the excess fluid 50, 52 in the pool portion 110 can be retained without easily flowing back into the evaporating portion 108 which could cause flooding.

In at least one example, the thermosiphon 100 can include a pool barrier 112. The pool barrier 112 can extend between the evaporating portion 108 and the pool portion 110. The pool barrier 112 can be operable to restrict flow of the fluid 50 to the pool portion 110 unless the volume of the fluid 50 in the evaporating portion is greater than the upper threshold of the evaporating volume. Accordingly, the pool barrier 112 can reduce or prevent the potential for dry out of the evaporating portion 108. However, the pool barrier 112 can extend a sufficient height to allow for the fluid 50 to flow from the evaporating portion 108 into the pool portion 110 to avoid flooding. The pool barrier 112 allows for better fluid distribution throughout the thermosiphon 100. In at least one example, as illustrated in FIGS. 1B and 1C, the pool barrier 112 can extend substantially vertically between the evaporating portion 108 and the pool portion 110. In some examples, the pool barrier 112 can extend at an angle between the the evaporating portion 108 and the pool portion 110. In some examples, the pool barrier 112 can be linear. In some examples, the pool barrier 112 can be curved. The pool barrier 112 can be configured to extend at an angle from the slope of the evaporating portion 108 so that the fluid 50 first pools within the evaporating portion 108 before flowing to the pool portion 110. Accordingly, the pool barrier 112 prevents too much fluid 50 from flowing directly from the evaporating portion 108 to the pool portion 110 to avoid dry out.

In at least one example, as illustrated in FIGS. 1B and 1C, the pool barrier 112 can include a first barrier 1120, an intermediate pool 1124, and a second barrier 1122. The intermediate pool 1124 can be formed between the first barrier 1120 and the second barrier 1122. The first barrier 1120 can be proximate to the evaporating portion 108 and extend between the evaporating portion 108 and the intermediate pool 1124. The second barrier 1122 can be proximate to the pool portion 110 and extend between the intermediate pool 1124 and the pool portion 110. The intermediate pool 1124 can be positioned higher than the pool portion 110. Accordingly, fluid 50 can flow from the evaporating portion 108 over the first barrier 1120 into the intermediate pool 1124 when the volume of the fluid 50 in the evaporating portion 108 exceeds the evaporating volume to avoid flooding of the evaporating portion 108. When the volume of the fluid 54 in the intermediate pool 1124 exceeds a desired threshold, the fluid 54 can flow from the intermediate pool 1124 over the second barrier 1122 into the pool portion 110.

Figure 3:
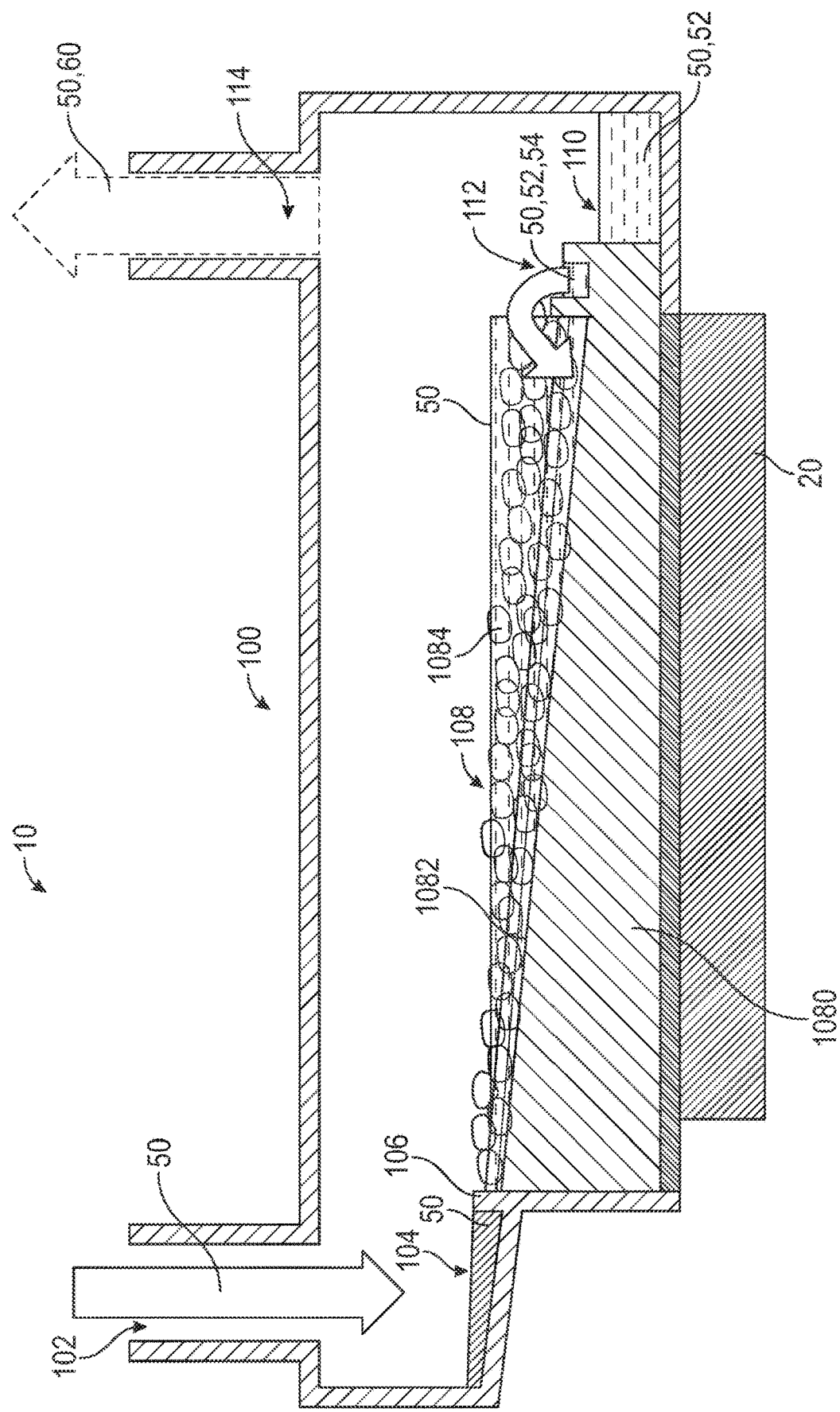
FIG. 3 illustrates a cross-sectional diagram of the thermosiphon with fluid circulating back.

In at least one example, as illustrated in FIG. 3, the pool barrier 112 can be operable to transfer the excess fluid 52 from the pool portion 110 to the evaporating portion 108 when the volume of the fluid 50 in the evaporating portion 108 is less than the predetermined range of the evaporating volume. Accordingly, with such a feature, the pool barrier 112 can utilize the fluid 52 retained in the pool portion 110 to add back to the evaporating portion 108 to prevent dry out (for example if sufficient fluid 50 is not flowing from the inlet portion 104 and/or if the computing component 20 is providing excess heat). In at least one example, the pool barrier 112 can be operable to transfer the excess fluid 52 form the pool portion 110 to the evaporating portion 108 via capillary force.

In at least one example, as illustrated in FIG. 3, the intermediate pool 1124 can provide fluid 50 back to the evaporating portion 108 via the first barrier 1120 when the volume of the fluid 50 in the evaporating portion 108 is less than the predetermined range of the evaporating volume. Accordingly, with such a feature, the first barrier 1120 can utilize the fluid 52 retained in the intermediate pool 1124 to add back to the evaporating portion 108 to prevent dry out (for example if sufficient fluid 50 is not flowing from the inlet portion 104 and/or if the computing component 20 is providing excess heat). In at least one example, the first barrier 1120 can be operable to transfer the excess fluid 52 form the intermediate pool 1124 to the evaporating portion 108 via capillary force.

In at least one example, the fluid 52 in the pool portion 110 can be transferred to the intermediate pool 1124 if the volume of fluid 54 in the intermediate pool 1124 is below a predetermined threshold. Accordingly, fluid 54 can be retained in the intermediate pool 1124 and be available to be provided back to the evaporating portion 108 when needed. In at least one example, the second barrier 1122 can be operable to transfer the excess fluid 52 form the pool portion 110 to the intermediate pool 1124 via capillary force.

In at least one example, the thermosiphon 100 may not include an intermediate pool 1124 such that it is a single pool barrier 112 between the evaporating portion 108 and the pool portion 110. For example, the pool barrier 112 can be similar to the inlet barrier 106 as shown in FIGS. 1B and 1C. In such an example, the fluid 52 in the pool portion 110 can be transferred directly to the evaporating portion 108 via the pool barrier 112.

Figure 4:
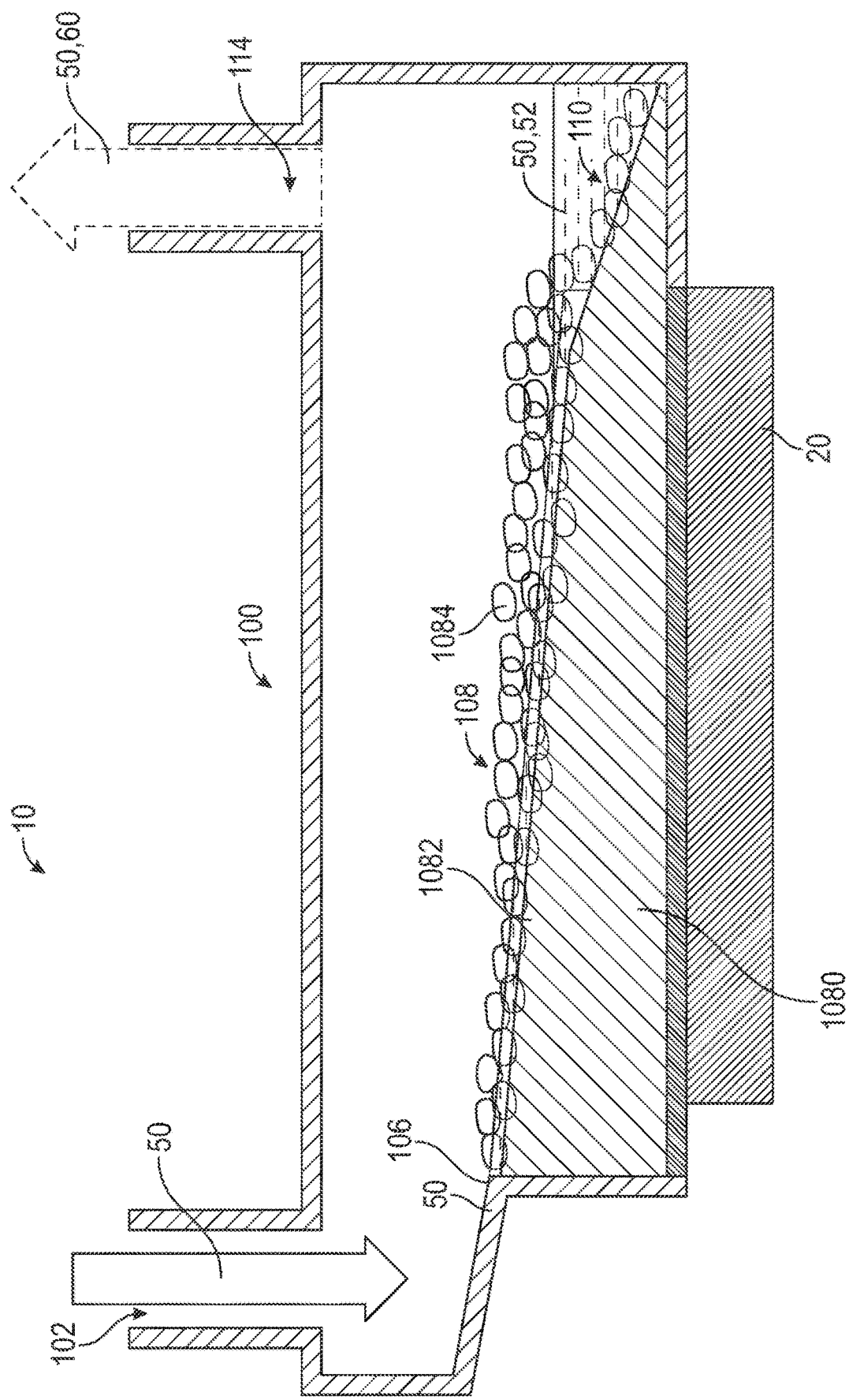
FIG. 4 illustrates a cross-sectional diagram of an example of the thermosiphon.

FIG. 4 illustrates the thermosiphon 100 without the inlet barrier and the pool barrier as in FIGS. 1B, 1C, and 3. The amount of fluid 50 retained on the evaporating surface 1082 of the evaporating portion 108 is controlled by the varying degrees of slope of the inlet portion 104, the evaporating portion 108, and/or the pool portion 110. The pool portion 110 can have a greater degree of slope than the evaporating portion 108 so that the pool portion 110 has a higher retention volume for excess fluid 52. Accordingly, the fluid 50 is retained on the evaporating portion 108 for a longer period of time as the slope is not as steep. This can prevent dry out. Similar, in some examples, the evaporating portion 108 can have a lesser degree of slope than the inlet portion 104 so that the fluid 50 flows out of the inlet portion 104 onto the evaporating portion 108 but then slows in flow speed on the evaporating portion 108 to prevent dry out.

Figure 5:
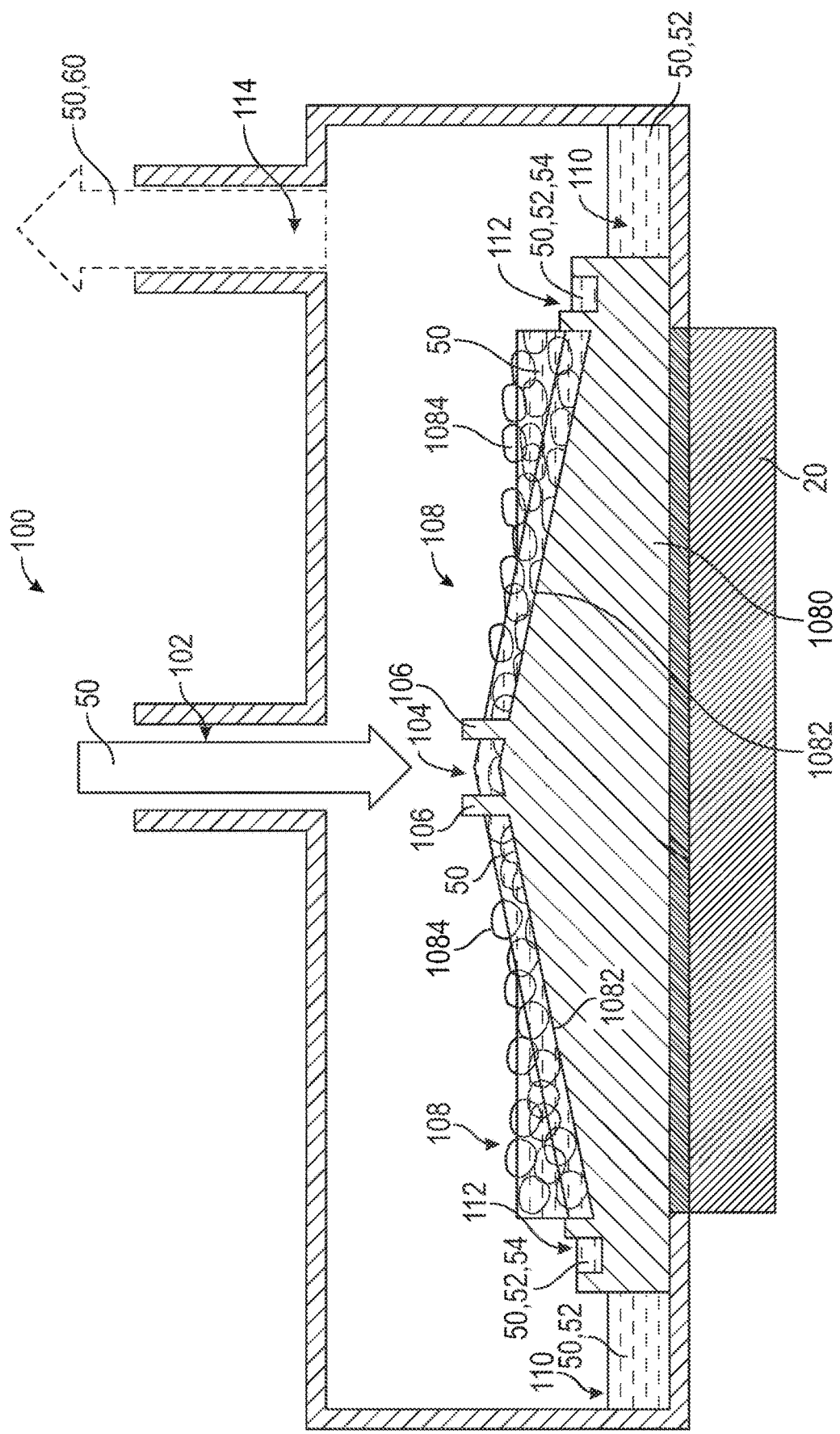
FIG. 5 illustrates a cross-sectional diagram of an example of the thermosiphon.

FIG. 5 illustrates the thermosiphon 100 where the inlet 102 and the corresponding inlet portion 104 is provided at the center of the evaporating portion 108. Accordingly, the fluid 50 can flow from the inlet portion 104 to the two sloping evaporating portions 108 on either side of the inlet portion 104. The inlet portion 104 can have two inlet barriers 106 to control the flow of the fluid 50 to either side of the evaporating portion 108. Additionally, in the thermosiphon 100 illustrated in FIG. 5, two pool portions 110 are provided to correspond to each evaporating portion 108. Each of the two pool portions 110 can have pool barriers 112 extending between the evaporating portions 108 and the pool portions 110.

Figure 6:
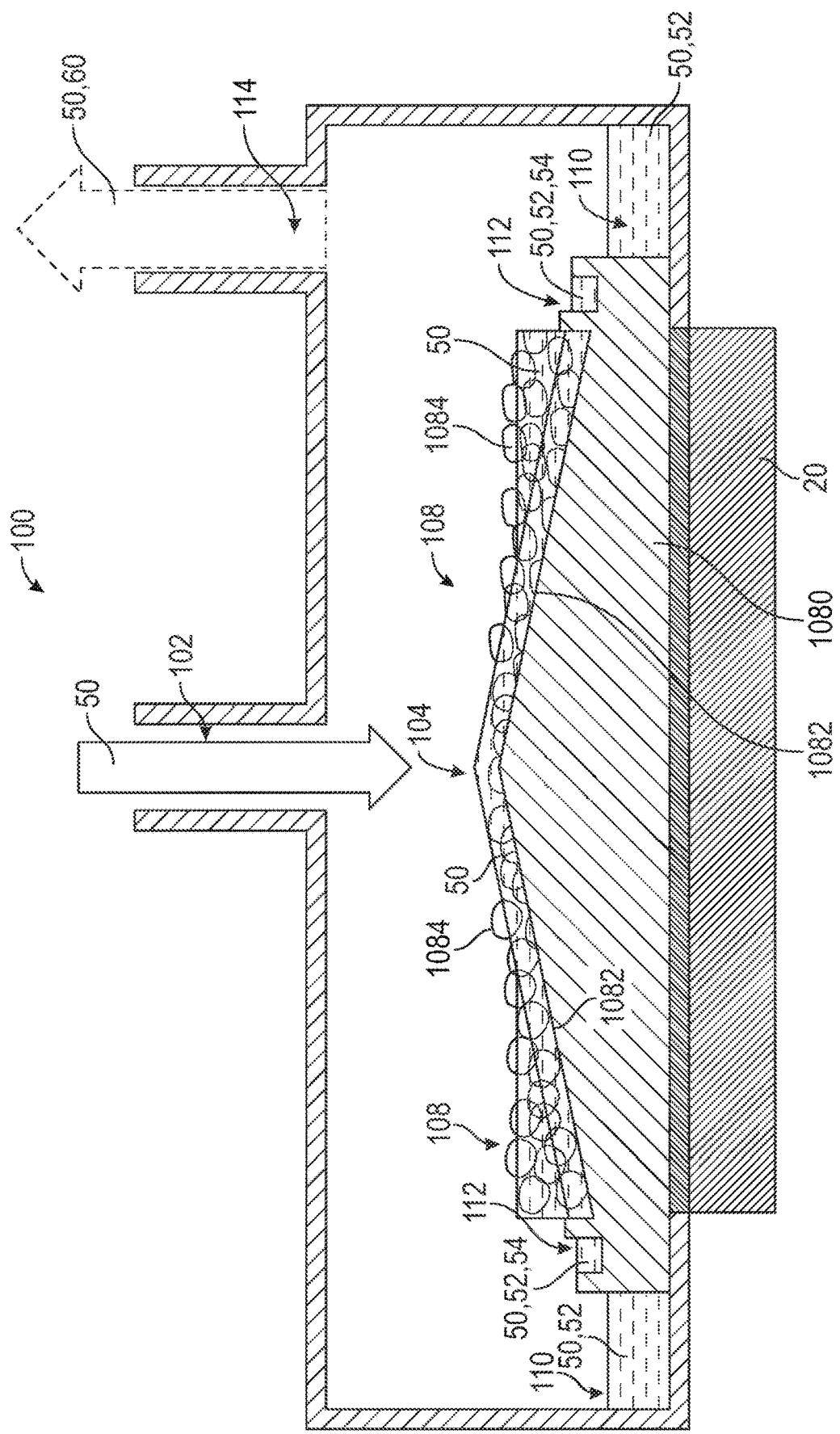
FIG. 6 illustrates a cross-sectional diagram of an example of the thermosiphon.

FIG. 6 illustrates the thermosiphon 100 of FIG. 5 but omitting the inlet barriers 106. Accordingly, the inlet portion 104 includes a meeting of two slopes for each of the evaporating portions 108. The fluid 50 then flows directly from the inlet 102 to the evaporating portions 108.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A thermosiphon for a computing system, the thermosiphon comprising:
an evaporating portion operable to be in thermal communication with a computing component, the evaporating portion operable to retain an evaporating volume of fluid to lower a temperature of the computing component;
a pool portion in fluid communication with the evaporating portion, the pool portion operable to receive excess fluid of the fluid from the evaporating portion when a volume of the fluid in the evaporating portion is greater than the evaporating volume; and
a pool barrier extending between the evaporating portion and the pool portion, the pool barrier operable to restrict flow of the fluid to the pool portion unless the volume of the fluid in the evaporating portion is greater than the evaporating volume.

2. The thermosiphon of claim 1, wherein the pool portion is operable to receive the excess fluid until the volume of the fluid in the evaporating portion is within a predetermined range of the evaporating volume.

3. The thermosiphon of claim 1, wherein the pool barrier is operable to transfer the excess fluid from the pool portion to the evaporating portion when the volume of the fluid in the evaporating portion is less than a predetermined range of the evaporating volume.

4. The thermosiphon of claim 3, wherein the pool barrier is operable to transfer the excess fluid from the pool portion to the evaporating portion via capillary force.

5. The thermosiphon of claim 1, wherein the evaporating portion has an evaporating surface that receives the fluid, the evaporating surface forming a slope down towards the pool portion such that the fluid flows towards the pool portion.

6. The thermosiphon of claim 5, wherein the evaporating portion has a non-uniform thickness of a base plate to form the slope.

7. The thermosiphon of claim 1, wherein the evaporating portion includes a heat transfer enhancement structure operable to assist with transfer of heat from the computing component to the fluid retained on the evaporating portion.

8. The thermosiphon of claim 7, wherein the heat transfer enhancement structure has a non-uniform thickness.

9. The thermosiphon of claim 1, further comprising an inlet portion operable to receive the fluid from a fluid source, wherein the inlet portion is in fluid communication with the evaporating portion such that the fluid flows from the inlet portion towards the evaporating portion.

10. The thermosiphon of claim 9, wherein the inlet portion forms a slope down towards the evaporating portion such that the fluid flows towards the evaporating portion.

11. The thermosiphon of claim 9, further comprising an inlet barrier extending between the inlet portion and the evaporating portion, the inlet barrier operable to restrict flow of the fluid from the inlet portion to the evaporating portion unless a volume of the fluid retained in the inlet portion is greater than an inlet volume.

12. A computing system comprising:
a computing component; and
a thermosiphon operable to lower a temperature of the computing component, the thermosiphon including:
an evaporating portion operable to be in thermal communication with the computing component, the evaporating portion operable to retain an evaporating volume of fluid to lower the temperature of the computing component;
a pool portion in fluid communication with the evaporating portion, the pool portion operable to receive excess fluid of the fluid from the evaporating portion when a volume of the fluid in the evaporating portion is greater than the evaporating volume; and
a pool barrier extending between the evaporating portion and the pool portion, the pool barrier operable to restrict flow of the fluid to the pool portion unless the volume of the fluid in the evaporating portion is greater than the evaporating volume.

13. The computing system of claim 12, wherein the pool portion is operable to receive the excess fluid until the volume of the fluid in the evaporating portion is within a predetermined range of the evaporating volume.

14. The computing system of claim 12, wherein the pool barrier is operable to transfer the excess fluid from the pool portion to the evaporating portion when the volume of the fluid in the evaporating portion is less than a predetermined range of the evaporating volume.

15. The computing system of claim 14, wherein the pool barrier is operable to transfer the excess fluid from the pool portion to the evaporating portion via capillary force.

16. The computing system of claim 12, wherein the evaporating portion has an evaporating surface that receives the fluid, the evaporating surface forming a slope down towards the pool portion such that the fluid flows towards the pool portion.

17. The computing system of claim 16, wherein the evaporating portion has a non-uniform thickness of a base plate to form the slope.

18. The computing system of claim 12, wherein the evaporating portion includes a heat transfer enhancement structure operable to assist with transfer of heat from the computing component to the fluid retained on the evaporating portion.

19. A thermosiphon for a computing system, the thermosiphon comprising:
an evaporating portion operable to be in thermal communication with a computing component, the evaporating portion operable to retain an evaporating volume of fluid to lower a temperature of the computing component;

a pool portion in fluid communication with the evaporating portion, the pool portion operable to receive excess fluid of the fluid from the evaporating portion when a volume of the fluid in the evaporating portion is greater than the evaporating volume; and an inlet portion operable to receive the fluid from a fluid source, wherein the inlet portion is in fluid communication with the evaporating portion such that the fluid flows from the inlet portion towards the evaporating portion.

* * * * *